(12) United States Patent
Littrell

(10) Patent No.: US 11,217,741 B2
(45) Date of Patent: Jan. 4, 2022

(54) MEMS PROCESS POWER

(71) Applicant: Vesper Technologies Inc., Boston, MA (US)

(72) Inventor: Robert Littrell, Boston, MA (US)

(73) Assignee: Vesper Technologies Inc., Boston, MA (US)

( * ) Notice: Subject to any disclaimer, the term of this patent is extended or adjusted under 35 U.S.C. 154(b) by 527 days.

(21) Appl. No.: 15/568,553

(22) PCT Filed: Apr. 22, 2016

(86) PCT No.: PCT/US2016/028770
§ 371 (c)(1),
(2) Date: Oct. 23, 2017

(87) PCT Pub. No.: WO2016/172431
PCT Pub. Date: Oct. 27, 2016

(65) Prior Publication Data
US 2018/0159021 A1 Jun. 7, 2018

Related U.S. Application Data

(60) Provisional application No. 62/152,731, filed on Apr. 24, 2015.

(51) Int. Cl.
*H01L 41/083* (2006.01)
*H01L 41/27* (2013.01)
(Continued)

(52) U.S. Cl.
CPC ........ *H01L 41/0838* (2013.01); *B81B 3/0072* (2013.01); *B81C 1/00666* (2013.01); *C23C 14/0641* (2013.01); *C23C 14/14* (2013.01); *C23C 14/34* (2013.01); *C23C 14/542* (2013.01); *H01L 41/04* (2013.01); *H01L 41/083* (2013.01); *H01L 41/1136* (2013.01); *H01L 41/27* (2013.01); *H01L 41/316* (2013.01); *H04R 7/06* (2013.01); *H04R 17/02* (2013.01);
(Continued)

(58) Field of Classification Search
CPC .......................... H01L 41/0838; H01L 41/083
See application file for complete search history.

(56) References Cited

U.S. PATENT DOCUMENTS

| | | | |
|---|---|---|---|
| 5,861,702 A | 1/1999 | Bishop et al. | |
| 2005/0035686 A1 | 2/2005 | Florian et al. | |

(Continued)

FOREIGN PATENT DOCUMENTS

| | | |
|---|---|---|
| JP | 2006173249 | 6/2006 |
| WO | WO2016/172431 | 10/2016 |

OTHER PUBLICATIONS

Extended European Search Report in corresponding Application No. 16783906.7 dated Dec. 21, 2018, pp. 1-7.
(Continued)

*Primary Examiner* — Bryan P Gordon
(74) *Attorney, Agent, or Firm* — Fish & Richardson P.C.

(57) ABSTRACT

A transducer includes a first piezoelectric layer; and a second piezoelectric layer that is above the first piezoelectric layer; wherein the second piezoelectric layer is a more compressive layer with an average stress that is less than or more compressive than an average stress of the first piezoelectric layer.

18 Claims, 7 Drawing Sheets

(51) Int. Cl.
*H01L 41/04* (2006.01)
*B81B 3/00* (2006.01)
*B81C 1/00* (2006.01)
*C23C 14/06* (2006.01)
*C23C 14/14* (2006.01)
*C23C 14/34* (2006.01)
*C23C 14/54* (2006.01)
*H01L 41/113* (2006.01)
*H01L 41/316* (2013.01)
*H04R 7/06* (2006.01)
*H04R 17/02* (2006.01)
*H04R 31/00* (2006.01)

(52) U.S. Cl.
CPC .... *H04R 31/003* (2013.01); *B81B 2201/0257* (2013.01); *B81B 2203/0118* (2013.01); *B81C 2201/017* (2013.01)

(56) References Cited

U.S. PATENT DOCUMENTS

| | | | | |
|---|---|---|---|---|
| 2006/0023606 | A1* | 2/2006 | Lutwyche | G11B 9/02 369/100 |
| 2008/0122317 | A1 | 5/2008 | Fazzio et al. | |
| 2010/0148637 | A1 | 6/2010 | Satou | |
| 2010/0254547 | A1* | 10/2010 | Grosh | H04R 17/02 381/114 |
| 2010/0327702 | A1* | 12/2010 | Martin | H01L 41/22 310/346 |
| 2013/0038177 | A1* | 2/2013 | Glazunov | H01L 41/0838 310/366 |
| 2014/0292941 | A1 | 10/2014 | Kobayashi et al. | |
| 2016/0254437 | A1* | 9/2016 | Yao | H01L 41/053 310/328 |

OTHER PUBLICATIONS

International Search Report and Written Opinion in corresponding PCT Application No. PCT/US2016/028770, dated Sep. 2, 2016, pp. 1-13.
Extended European Search Report in EP Appln. No. 20177752.1, dated Aug. 27, 2020, 5 pages.

* cited by examiner

MEMS PROCESS POWER

SUMMARY

A transducer includes a first piezoelectric layer; and a second piezoelectric layer that is above the first piezoelectric layer; wherein the second piezoelectric layer is a more compressive layer with an average stress that is less than or more compressive than an average stress of the first piezoelectric layer. In an example, the transducer includes a stack of layers that comprise the first and second piezoelectric layers, wherein a third layer in the stack is between the first and second piezoelectric layers. The second piezoelectric layer is fabricated by adjusting a bias power to a level that produces a vertical stress that is less than or more compressive than a vertical stress of the first piezoelectric layer. A vertical stress of the second piezoelectric layer offsets a vertical stress of the first piezoelectric layer to eliminate deflection in the acoustic transducer. The transducer comprises a MEMS transducer, an acoustic transducer, a piezoelectric transducer or a microphone.

In some examples, a method includes depositing a first piezoelectric layer on a substrate; depositing an intervening layer on the first piezoelectric layer; obtaining information indicative of a first vertical stress of the first piezoelectric layer; determining a second vertical stress that offsets the first vertical stress such that a combination of the first and second vertical stresses is a substantially zero deflection of the transducer; selecting a bias power that produces the second vertical stress; and depositing, using the selected bias power, the second piezoelectric layer on the intervening layer. Other embodiments of this aspect include corresponding computer systems, apparatus, and computer programs recorded on one or more computer storage devices, each configured to perform the actions of the methods.

In this example, deposition of the second piezoelectric layer uses the selected bias power throughout an entirety of deposition of the second piezoelectric layer. The actions include adjusting a bias power on a deposition tool to be the selected bias power. The intervening layer is a layer of molybdenum.

In another example, a transducer includes a first piezoelectric layer; and a second piezoelectric layer that is above the first piezoelectric layer; wherein the second piezoelectric layer has an average stress that compensates for a non-uniform amount of stress through a thickness of the first piezoelectric layer such that the first and second piezoelectric layers lie substantially flat. In this example, the second piezoelectric layer compensates for the non-uniform amount of stress by being more compressive than the first piezoelectric layer, when the stress of the first piezoelectric layer becomes more tensile (increases) as the thickness of the first piezoelectric layer increases, or by being more tensile than the first piezoelectric layer, when the stress of the first piezoelectric layer becomes more compressive (decreases) as the thickness of the first piezoelectric layer increases. A compressive layer is a layer that deflects downwards and wherein a tensile layer is a layer that deflects upwards.

In still another example, a system of one or more computers can be configured to perform particular operations or actions (e.g., described above) by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

DETAILED DESCRIPTION

A transducer device (e.g., a microphone) includes multiple (e.g., two) piezoelectric layers and the other layers are very thin. There are various types of transducer devices, e.g., acoustic transducer devices, microphones, energy harvesters, resonators, Microelectromechanical systems (MEMS) transducer devices, and so forth. In a MEMS transducer, two piezoelectric layers are used, e.g., to obtain twice the amount of energy that would be obtained from a non-MEMS transducer.

Figure 1:
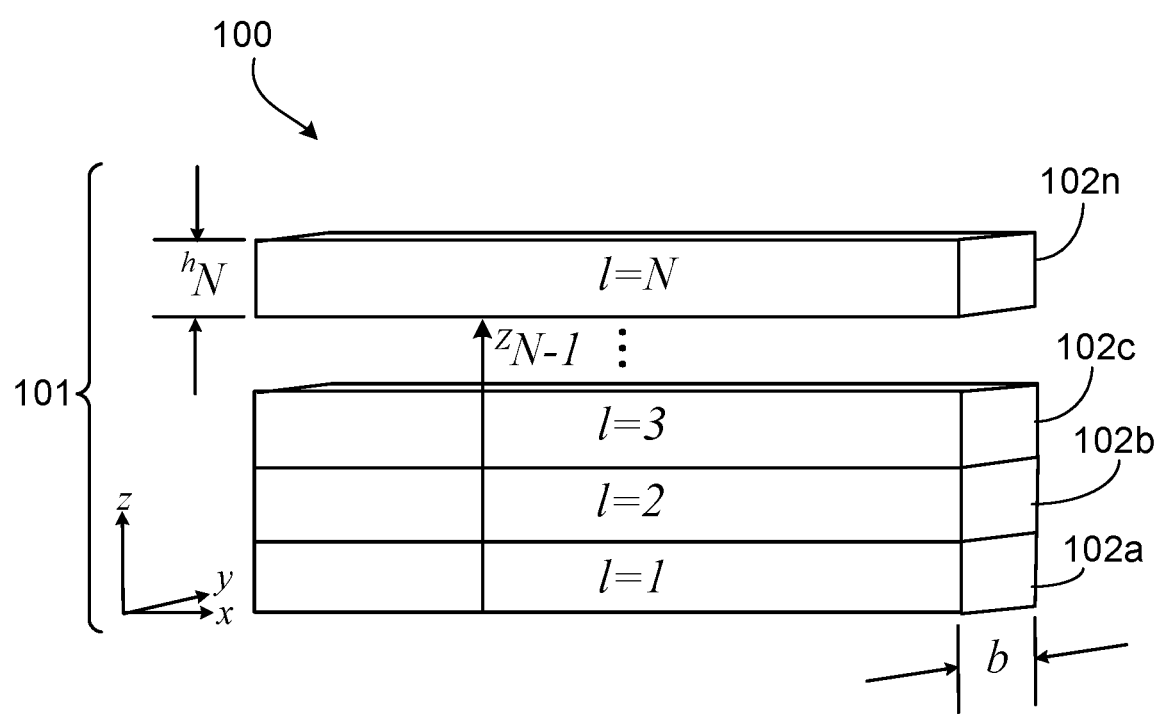
FIG. 1 is a diagram of a transducer device.

Referring to FIG. 1, transducer device 100 is fabricated as cantilever 101 or a plate. In this example, cantilever 101 includes a cantilevered beam (hereinafter "beam"). Cantilever 101 includes various layers 102a . . . 102n of materials, with each layer including its own vertical stress (as shown in a vertical stress profile). In order to fabricate a level (e.g., flat) cantilever that does not bend, the average stresses among various layers 102a . . . 102n are balanced to achieve a flat device. Balancing of the stresses is facilitated by cantilever 101 comprising different types of materials at various layers 102a . . . 102n, such that the different materials have different stresses, which can be used to balance each other out.

In general, the curvature of a multi-layer cantilever is computed (e.g., by a system) in accordance with the following equation:

$$\kappa = \frac{1}{EI} \int_0^{z_N} \sigma(z) \cdot (z - c) \, dz$$

where κ (kappa) is curvature (e.g., second derivative of displacement), σ is the film residual stress (as a function of z), z is a distance from a bottom of cantilever 101. Each of layers 102a . . . 102n has an associated height. For example, the height of layer 102n is $h_N$. In this example, cantilever 101 can be characterized in accordance with the following equations:

$$EI = \frac{b}{3} \sum_{i=1}^{N} E_i [(z_i - c)^3 - (z_{i-1} - c)^3]$$

and $$c = \frac{1}{2} \frac{\sum_{i=1}^{N} E_i (z_i^2 - z_{i-1}^2)}{\sum_{i=1}^{N} E_i (z_i - z_{i-1})}$$

where $E_i$ is the modulus of elasticity of layer i and b is the beam width. EI is the product of the Young's modulus (E) and the moment of inertia (I), and c is the neutral axis, the z location at which a deflected plate does not get longer or shorter. σ is not a constant. Rather, σ is a function of z, i.e., σ(z). If the integral shown above (e.g., $$\int_0^{z_N} \sigma(z) \cdot (z-c) \, dz\biggr)$$

is equal to zero throughout the thickness of the multi-layer cantilever, the cantilever is going to be flat. Accordingly, the integral will have different values for σ at the different layers. So, for the top AlN layer, σ is used to adjust the offset, e.g., by adjusting the bias power. That is, via adjustment of the bias power, the amount of vertical stress of the two piezoelectric layers offset each other for minimal or zero deflection. In this example, a "recipe" is determined for an appropriate bias power to provide a required offset, e.g., an offset at which the cantilever lies flat (e.g., as determined by visual inspection or by application of the foregoing equations). As such, σ of the bottom AlN layer will have a different value from σ of the top AlN layer. So, σ for the top layer is adjusted (via the bias power) to make it more compressive, so that when you integrate through z the cantilever has zero curvature.

In a MEMS device, two piezoelectric layers are used. Aluminum nitride (AlN) is one type of piezoelectric material used for a piezoelectric layer. In some example, the AlN is doped aluminum nitride (AlN doped with scandium) to obtain AlN with higher sensitivity and output signal. In still other example, other materials could be used in fabricating a beam or transducer using the techniques described herein.

Aluminum nitride (AlN) becomes more tensile as it is deposited. If the average stress of two piezoelectric layers (e.g., two AlN layers) in a stack (of layers that form the cantilever) are the same, a cantilever will not be flat but will bend up.

To address this issue of curvature in MEMS devices, a deposition recipe can be adjusted in order to achieve a film that does not become more tensile as it gets thicker. For example, continual adjustment of gas flow rates throughout deposition can be used to eliminate a vertical stress profile of AlN. However, this continual adjustment technique may degrade the crystalline structures of a deposition layer.

Another technique is to adjust the stress of the second layer to achieve flat plates. For example, the average stress of the second layer is fabricated to be about 245 MPa more compressive than the first, to achieve flat plates (e.g., layers) for the cantilever.

Figure 2:
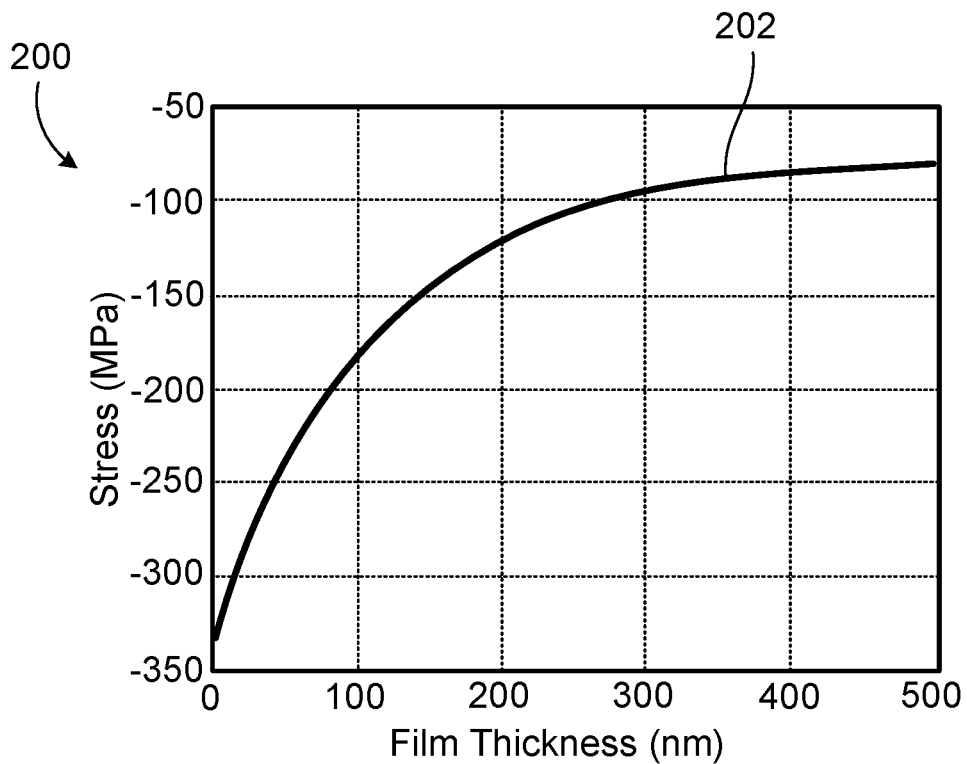
FIGS. 2-10 are plot diagrams.

Referring to FIG. 2, plot 200 includes curve 202 that expresses the relationship between stress and film thickness. In this example, as the thickness (of AlN) increases the stress increases, causing the layer to become more tensile as it gets thicker.

As shown in plot 200, the vertical stress of a layer increases as the thickness increases. In this example, the stress of the first piezoelectric layer becomes more tensile (increases) as the thickness of the first piezoelectric layer increases. In another example (not shown in FIG. 2), the stress of the first piezoelectric layer becomes more compressive (decreases) as the thickness of the first piezoelectric layer increases. A cantilever has multiple layers. However, in this case, the AlN layers constitute the majority of the beam thickness and the AlN layers mainly contribute to deflection.

Figure 3:
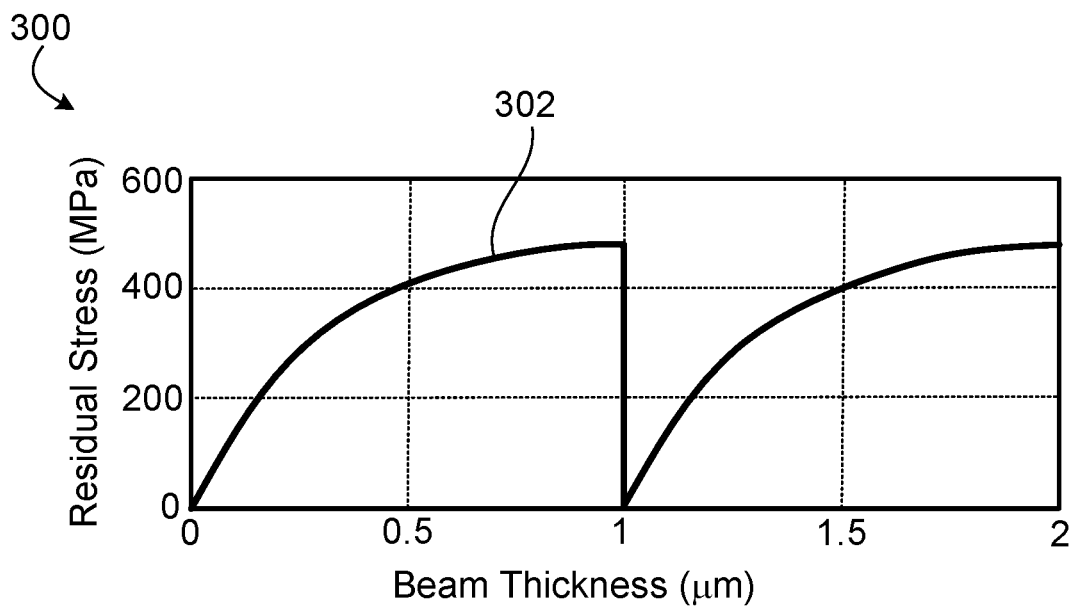

Referring to FIG. 3, plot 300 includes curve 302 that expresses a relationship between residual stresses and beam thickness, e.g., for different portions of the beam (e.g., cantilever 101).

In the example of FIG. 3, the beam has a total thickness of 2 micrometers (μm). The first 0-1 μm of the beam comprises a first AlN layer and an average stress of 356 MPA. As shown in FIG. 3, the amount of residual stress from 0-1 μm increases from approximately 0 MPa to almost 500 MPa, with the increase forming a vertical stress gradient. The second AlN layer corresponds to the portion of the beam that has a thickness of 1 μm to 2 μm and has the same residual stress profile and average stress as the first AlN layer.

Figure 4:
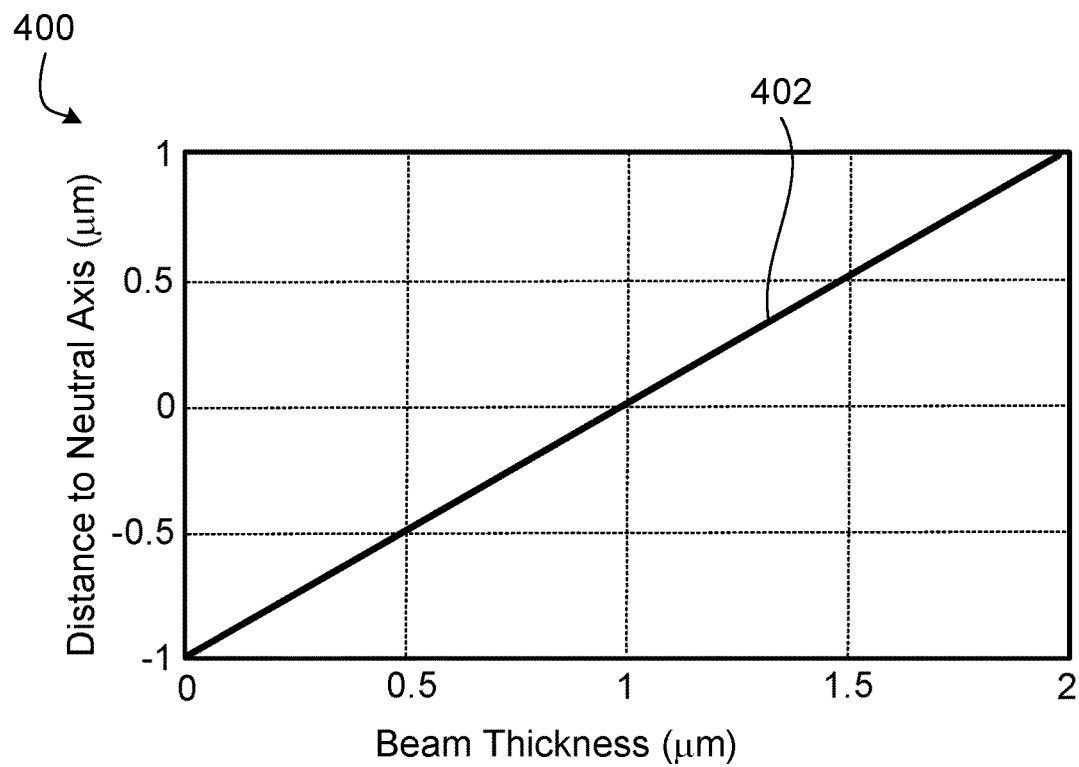

Referring to FIG. 4, plot 400 includes line 402 to graphically illustrate the above integral (e.g., $$\int_0^{z_N} \sigma(z) \cdot (z-c) \, dz\biggr).$$

In particular, line 402 represents a distance to the neutral axis, c, as a function of beam thickness.

Figure 5:
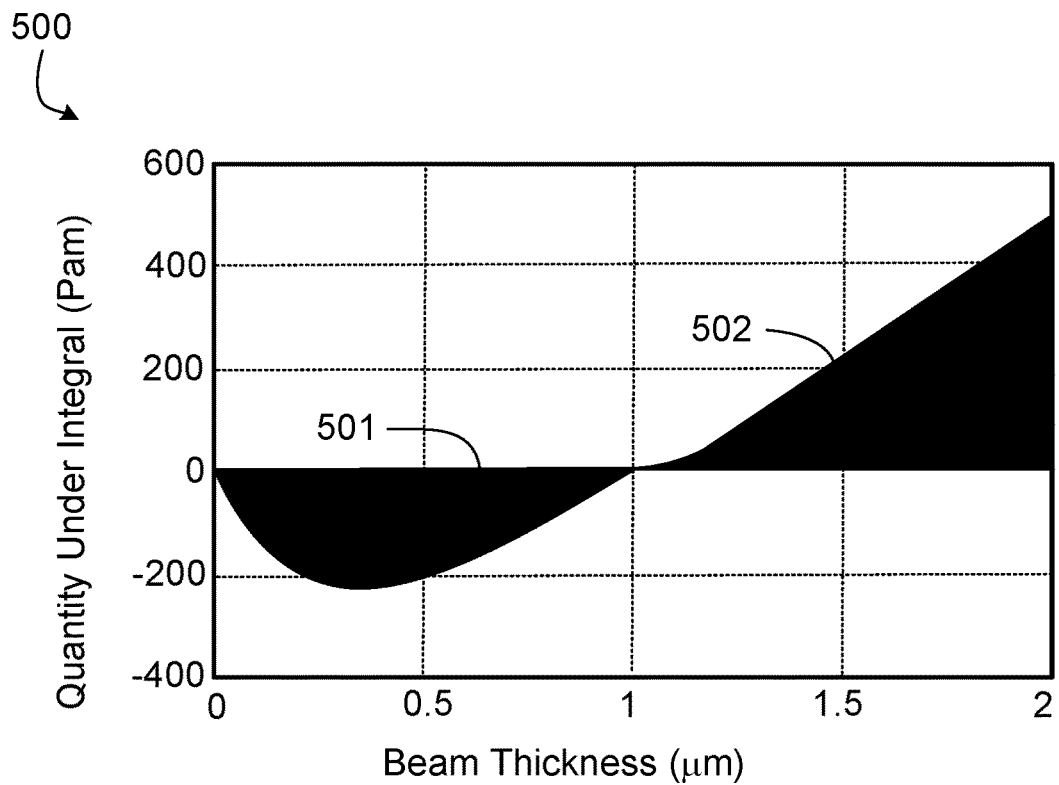

Referring to FIG. 5, plot 500 includes areas 501, 502, which represent a total quantity under the integral, e.g., based on multiplying curve 300 in FIG. 3 by line 400 in FIG. 4. Area 502 represents that the total area under the integral is positive, in which case the curvature will be a positive number and the beam will bend up. Area 501 represents that the area under the integral is negative, in which case the curvature will be negative and the beam will bend down.

Figure 6:
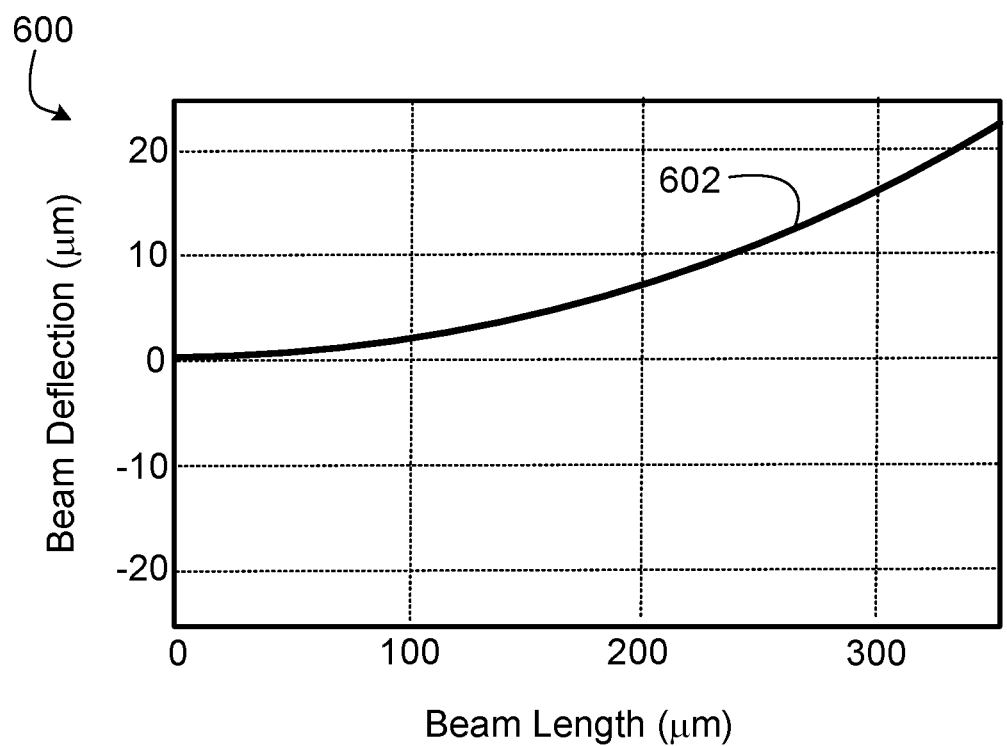

Referring to FIG. 6, plot 600 includes curve 602 which expresses a relationship between beam deflection and beam length. In this example, the curvature is 363/m and the deflection of a 350 μm long cantilever beam is shown by curve 602.

Because the AlN layers have the same stress profiles, the deflection increases across the length of the beam—as shown in FIG. 6. If bias powers are substantially (e.g., exactly) the same (e.g., because the same recipe is being used) to deposit layers, then each piezoelectric layer will have substantially the same stress.

Figure 7:
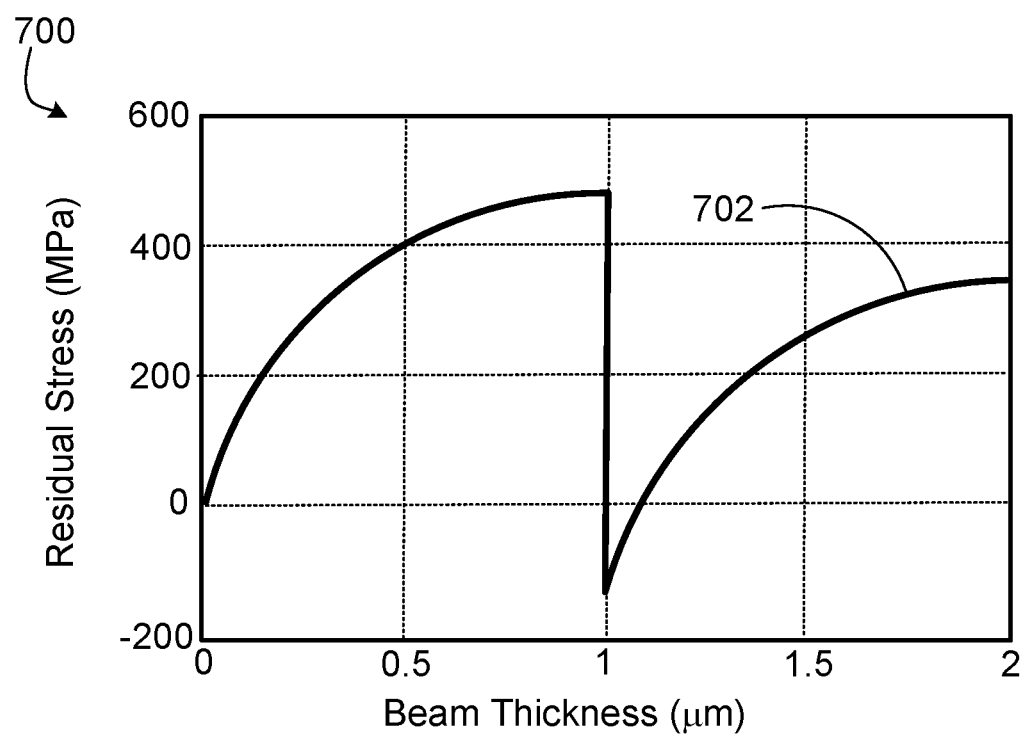
Figure 8:
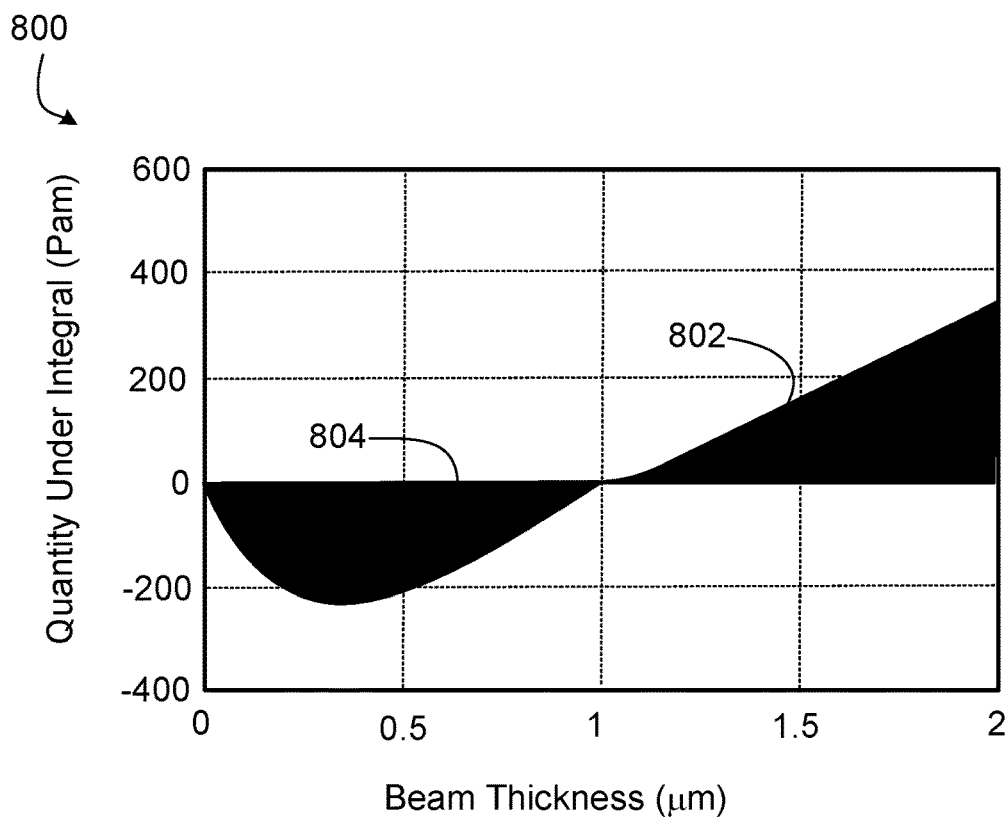
Figure 9:
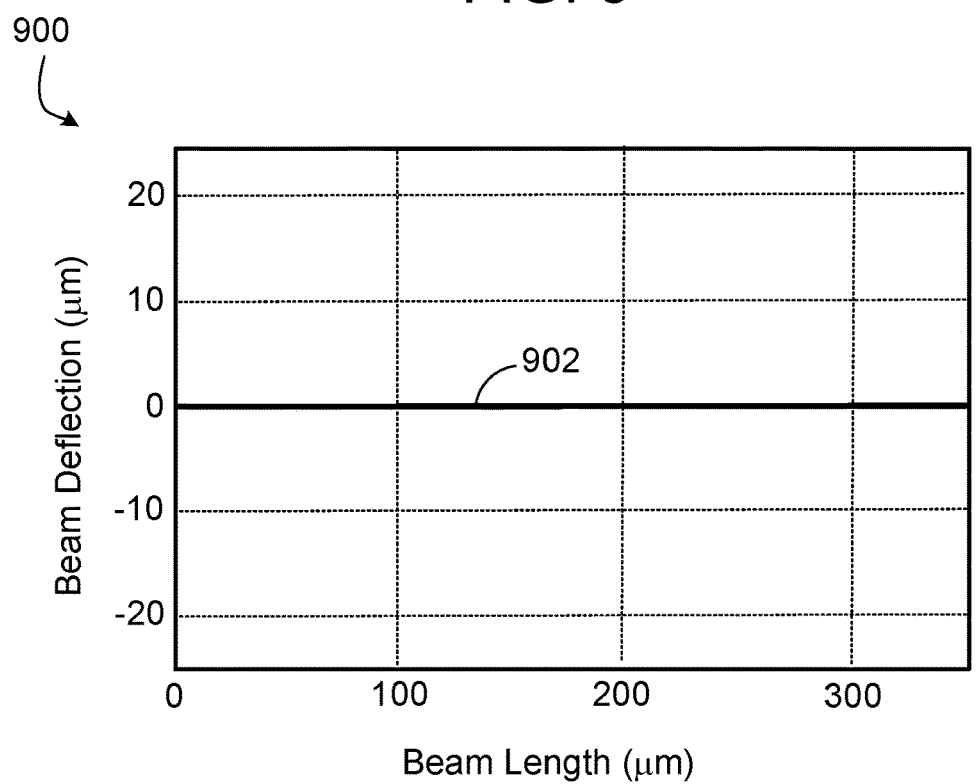

In order to reduce the beam deflection, the average stress of the second AlN layer can be reduced. In this example, the average stress of the second AlN layer has been reduced by 137 MPa. Referring to FIG. 7, plot 700 includes curve 702 that represents the stress profile of the two layers. Referring to FIG. 8, plot 800 includes areas 802, 804, which represent the area under the integral. The adjusted stress profile now provides a curvature of −0.3/m, much closer to zero than the curvature above. Referring to FIG. 9, plot 900 includes line 902, which represents the relationship between beam length and beam deflection, e.g., of the beam in this example in which the average stress of the second AlN layer is reduced by 137 MPa.

In operation, a deposition tool deposits various layers on a substrate to fabricate the cantilever beam. The deposition tools allows for the adjustment of bias power. By adjusting the bias power, the vertical stress of the two piezoelectric layers offset each other for minimal or zero deflection, as shown in plots 700, 800, 900 of FIGS. 7-9, respectively.

Referring back to FIG. 7, the first AlN layer (corresponding to the portion of the beam from approximately 0-1 μm and represented in plot 700 as the beam thickness from 0-1 μm) has an amount of residual stress increasing from approximately 0 MPa to almost 500 MPa. The second AlN layer (corresponding to the portion of the beam from approximately 1-2 μm and represented in plot 700 as the beam thickness from 1-2 μm) has an amount of residual stress increasing from approximately −100 MPa to almost 400 to offset the amount of residual stress in the first AlN layer. In this example, the second AlN layer is deposited with a bias power that differs from the bias power used in depositing the first AlN layer. The vertical stress of the second AlN layer offsets the vertical stress of the first AlN layer such that a combination of these vertical stresses is a substantially zero vertical deflection.

The difference between the average residual stress of the first layer and the average residual stress of the second layer produces an offset that reduces (or eliminates) deflection in the cantilever beam, causing the beam to lie flat. If the second layer has an average stress that is less than or more negative than the average residual stress of the first layer, then an offset is formed that causes the cantilever to bend downward. In particular, the top layer of AlN (e.g., the second layer) is fabricated to be a compressive layer to compensate for the vertical stress in both the bottom and top layers of AlN (e.g., the first layer) and any stress imparted by other layers in the cantilever beam (e.g., such as molybdenum layers).

Generally, bias power includes a direct current (DC) deliberately made to flow, or DC voltage deliberately applied, between two points (e.g., between the chamber and the sputter target). A type of bias power is radio frequency (rf) power (e.g., rf bias power), which deposition tools apply to wafers in fabricating the cantilevers. In using the deposition tool, a wafer is placed face down on a platen. Rf power (e.g., in the range of 30-300 W) is applied between the target and the wafer, creating low energy ion bombardment during film growth (e.g., growth of a film as a layer).

Figure 10:
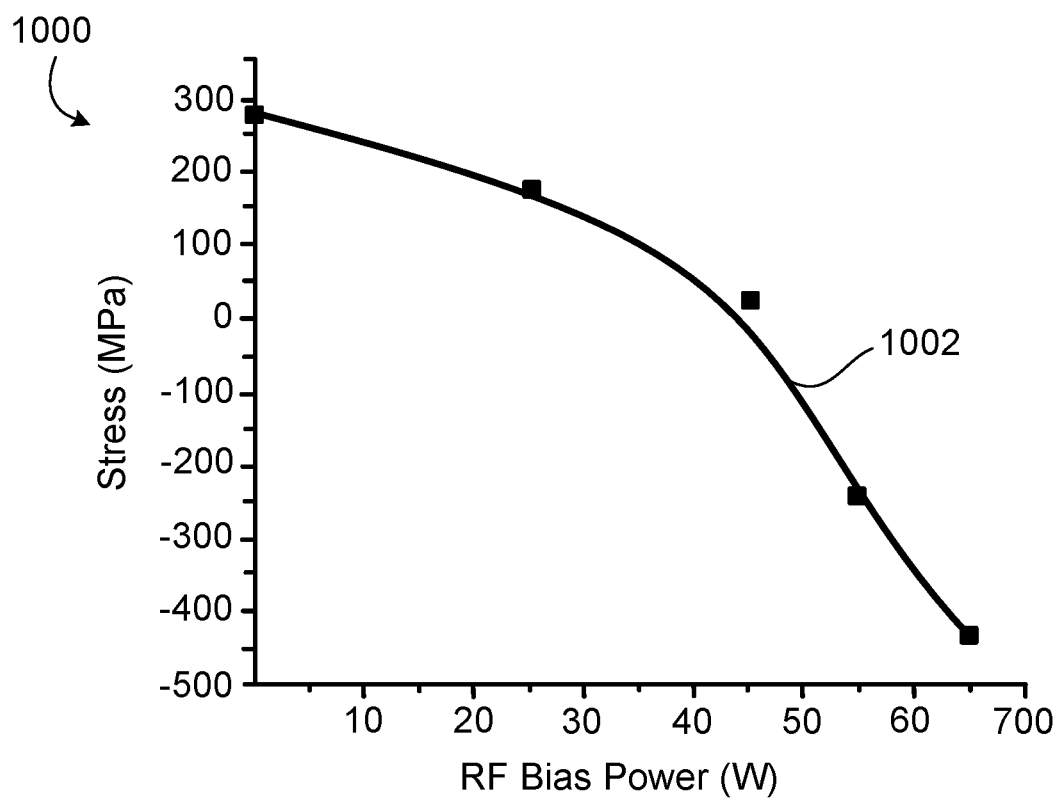

Referring to FIG. 10, plot 1000 includes curve 1002 that represents the relationship between bias power and stress. Stress is a function of if bias power. In this example, the stress is for 1000 nm thick AlN films. There is a defined relationship between stress and bias power, in which stress decreases as bias power increases. So, to obtain a top AlN layer of a particular amount of vertical stress that is required to offset the vertical stress profile of the bottom AlN layer, a system consistent with this disclosure determines the average stress of the top layer (needed to eliminate deflection) and adjusts the bias power to obtain that average stress, in accordance with the defined relationship between bias power and stress.

In this example, the bias power affects sigma. An increase in the bias power causes sigma to decrease. By increasing the bias power, the average stress in a layer is decreased. By decreasing the bias power, the average stress in a layer increases. Referring back to FIG. 7, the bias power is used to shift the average amount of stress of the second AlN layer to be lower, so decreasing the average stress—to make it more compressive, more negative stress. In this example, the bias power is an input on the sputter tool and bias power is not continuously adjusted during deposition, to ensure quality and integrity of the deposited layers. That is, adjustment of the bias during deposition (as opposed to determining an amount of bias power to be applied to obtain a compressive layer), may reduce the structural quality of a layer. Film stress can be adjusted in ways other than adjusting RF bias, such as by adjusting Ar or N2 gas flow rates.

Figure 11:
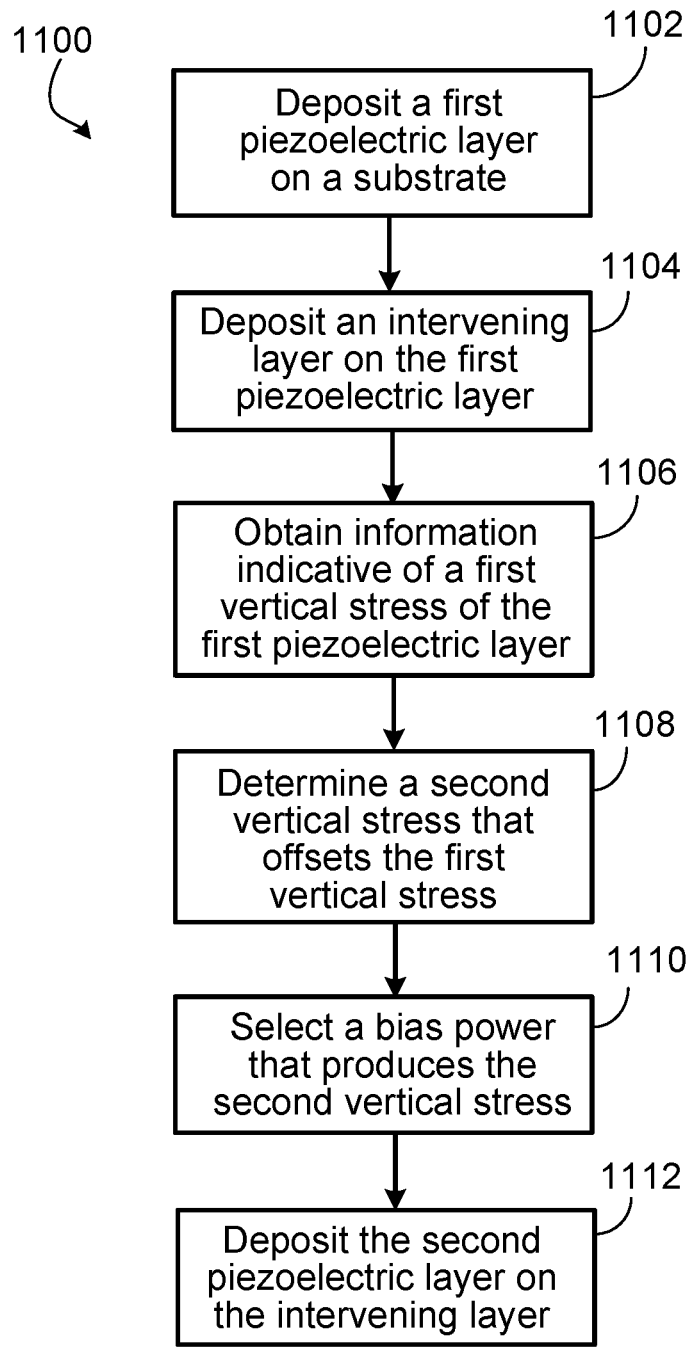
FIG. 11 is a flowchart of a process for fabricating a transducer device.

Referring to FIG. 11, a system (or a fabrication device) implements process 1100 for fabricating a transducer. In operation, the system deposits (1102) a first piezoelectric layer on a substrate. The system also deposits (1104) an intervening layer on the first piezoelectric layer. The system obtains (1106), e.g., from an external data repository or from execution of instructions for determining a vertical stress, information indicative of a first vertical stress of the first piezoelectric layer. The system determines (1108) a second vertical stress that offsets the first vertical stress such that a combination of the first and second vertical stresses is a substantially zero deflection of the transducer. The system selects (1110) a bias power that produces the second vertical stress. The system deposits (1112), using the selected bias power, the second piezoelectric layer on the intervening layer. In this example, deposition of the second piezoelectric layer uses the selected bias power throughout an entirety of deposition of the second piezoelectric layer. The system also adjusts a bias power on a deposition tool to be the selected bias power. In this example, the intervening layer is a layer of molybdenum.

The techniques described herein may be used to compensate for a non-uniform amount of stress through a thickness of the first piezoelectric layer, e.g., by making the second layer more compressive or tensile. A non-uniform amount of stress causes deflection, whether upwards or downwards. That is, the foregoing equations may be used to determine and to adjust an initial (or original) curvature of layers and an entire cantilever, e.g., whether that initial curvature is positive or negative. In this example, an acoustic transducer includes a first piezoelectric layer; and a second piezoelectric layer that is above the first piezoelectric layer; wherein the second piezoelectric layer has an average stress that compensates for a non-uniform amount of stress through a thickness of the first piezoelectric layer such that the first and second piezoelectric layers lie substantially flat, e.g., by having less than a threshold amount of curvature or deflection. The second piezoelectric layer compensates for the non-uniform amount of stress by being more compressive than the first piezoelectric layer, when the first piezoelectric layer is a tensile layer, or by being more tensile than the first piezoelectric layer, when the first piezoelectric layer is a compressive layer. A compressive layer is a layer that deflects downwards and a tensile layer is a layer that deflects upwards.

The techniques describes herein may be used to fabricate a beam or a plate. In turn, an acoustic transducer or a transducer may be comprised of one or a plurality of these beams/plates.

Embodiments can be implemented in digital electronic circuitry, or in computer hardware, firmware, software, or in combinations thereof. Apparatus can be implemented in a computer program product tangibly embodied or stored in a machine-readable storage device for execution by a programmable processor; and method actions can be performed by a programmable processor executing a program of instructions to perform functions by operating on input data and generating output. The techniques described herein can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD_ROM disks. Any of the foregoing can be supplemented by, or incorporated in, ASICs (application-specific integrated circuits).

Other embodiments are within the scope and spirit of the description and the claims. Additionally, due to the nature of software, functions described above can be implemented using software, hardware, firmware, hardwiring, or combinations of any of these. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

A number of embodiments have been described. Nevertheless, it will be understood that various modifications may be made without departing from the spirit and scope of the claims and the examples of the techniques described herein.

What is claimed is:

1. A transducer comprising:
   a first piezoelectric layer; and
   a second piezoelectric layer that is above the first piezoelectric layer;
   wherein the first piezoelectric layer has non-uniform amount of residual stress that becomes more tensile as the thickness of the first piezoelectric layer increases, and the second piezoelectric layer has an average residual stress that is more compressive than an average residual stress of the first piezoelectric layer, or
   wherein the first piezoelectric layer has non-uniform amount of residual stress that becomes more compressive as the thickness of the first piezoelectric layer increases, and the second piezoelectric layer has an average residual stress that is more tensile than an average residual stress of the first piezoelectric layer; and
   wherein the first and second piezoelectric layers lie substantially flat.

2. The transducer of claim 1, wherein a compressive layer is a layer that deflects downwards and wherein a tensile layer is a layer that deflects upwards.

3. The transducer of claim 1, wherein the second piezoelectric layer is a more compressive layer with an average residual stress that is less than or more compressive than the average residual stress of the first piezoelectric layer.

4. The transducer of claim 1, wherein the second piezoelectric layer is a more tensile layer with an average residual stress that is greater than or less compressive than the average residual stress of the first piezoelectric layer.

5. The transducer of claim 1, wherein a vertical stress of the second piezoelectric layer offsets a vertical stress of the first piezoelectric layer to eliminate deflection in the transducer.

6. The transducer of claim 1, wherein the transducer comprises a MEMS transducer, an acoustic transducer, a piezoelectric transducer or a microphone.

7. The transducer of claim 1, further comprising a third intervening layer between the first and second piezoelectric layers.

8. The transducer of claim 7, wherein the third intervening layer comprises a layer of molybdenum.

9. The transducer of claim 7, wherein the average residual stress of the second piezoelectric layer compensates for a residual stress imparted by the third intervening layer.

10. The transducer of claim 1, wherein the first and second piezoelectric layers form a cantilever.

11. The transducer of claim 1, wherein the first and second piezoelectric layers comprise the same material.

12. The transducer of claim 11, wherein the first and second piezoelectric layers comprise layers of aluminum nitride.

13. The transducer of claim 1, wherein the first piezoelectric layer comprises a different material than the second piezoelectric material.

14. The transducer of claim 1, wherein the second piezoelectric layer is fabricated by adjusting a bias power to a level that produces the average residual stress that compensates for the non-uniform amount of residual stress through the thickness of the first piezoelectric layer.

15. The transducer of claim 14, wherein the level of the bias power is used throughout an entirety of the fabrication of the second piezoelectric material.

16. The transducer of claim 1, wherein the second piezoelectric layer is fabricated by adjusting a gas flow rate to a level that produces the average residual stress that compensates for the non-uniform amount of residual stress through the thickness of the first piezoelectric layer.

17. The transducer of claim 1, wherein the first and second piezoelectric layers lying substantially flat comprises the first and the second piezoelectric layers having less than a threshold amount of curvature or deflection.

18. The transducer of claim 1, wherein the second piezoelectric layer comprises a non-uniform amount of vertical stress.

* * * * *